United States Patent [19]
Allen et al.

[11] Patent Number: 4,944,835
[45] Date of Patent: Jul. 31, 1990

[54] SEEDING PROCESS IN ZONE RECRYSTALLIZATION

[75] Inventors: Lisa P. Allen, Norton; Duy-Phach Vu, Taunton; Michael W. Batty, No. Attleboro; Richard H. Morrision, Jr., Taunton; Paul M. Zavracky, Norwood, all of Mass.

[73] Assignee: Kopin Corporation, Taunton, Mass.

[21] Appl. No.: 330,458

[22] Filed: Mar. 30, 1989

[51] Int. Cl.$^5$ .............. C30B 13/32; C30B 1/08; C30B 19/08; C30B 29/06
[52] U.S. Cl. .............. 156/620.7; 156/620.71; 156/DIG. 64; 156/DIG. 88
[58] Field of Search ........... 156/620.7, 620.71, 620.72, 156/624, 662, DIG. 64, DIG. 88, DIG. 111

[56] References Cited

U.S. PATENT DOCUMENTS

| | | | |
|---|---|---|---|
| 4,371,421 | 2/1983 | Fan et al. | 156/624 |
| 4,444,620 | 4/1984 | Kovacs et al. | 156/DIG. 64 |
| 4,461,670 | 7/1984 | Celler et al. | 156/620.72 |
| 4,496,418 | 1/1985 | Ham | 156/DIG. 111 |
| 4,497,683 | 2/1985 | Celler et al. | 156/613 |
| 4,670,086 | 6/1987 | Leamy | 156/DIG. 64 |
| 4,670,088 | 6/1987 | Tsaur et al. | 156/617 R |
| 4,704,186 | 11/1987 | Jastrzebski | 156/DIG. 64 |
| 4,727,047 | 2/1988 | Bozler et al. | 437/89 |

Primary Examiner—Gary P. Straub
Attorney, Agent, or Firm—Hamilton, Brook, Smith & Reynolds

[57] ABSTRACT

An improved method of forming seed openings for zone-melting and recrystallization of polysilicon film on an insulator over silicon (SOI) is described. This method comprises forming a narrow discontinuous pattern of seed openings formed by an overlapping sub-pattern of discontinuous shaped openings. Alternatively, in an edge bead seed embodiment, a resist is removed from an SOI precursor structure, comprising an insulator on an Si wafer, thus exposing the peripheral edge of the insulator. The exposed insulator is then also removed to provide a peripheral edge seed opening to the underlying Si wafer.

13 Claims, 3 Drawing Sheets

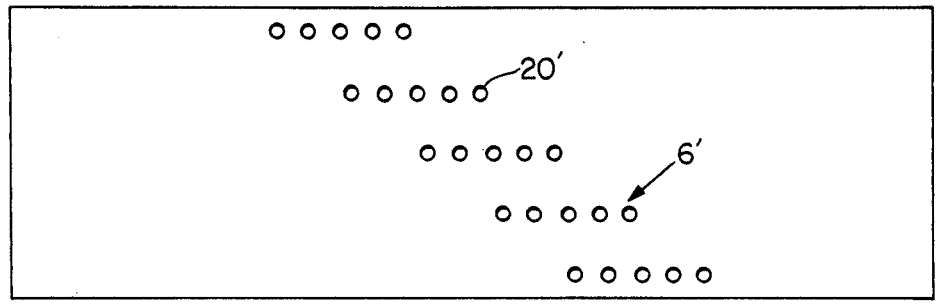
Fig. 7
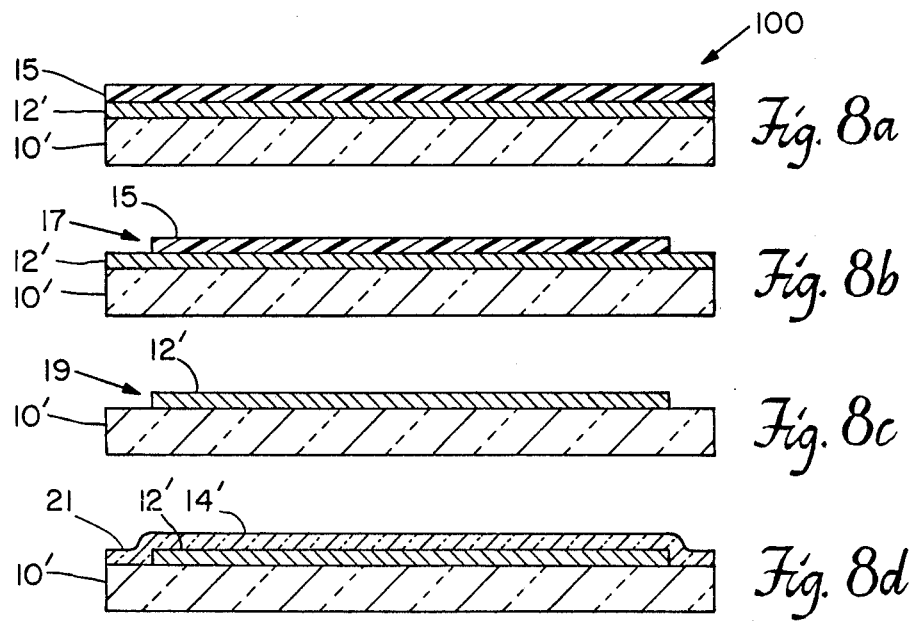
Fig. 8a
Fig. 8b
Fig. 8c
Fig. 8d

SEEDING PROCESS IN ZONE RECRYSTALLIZATION

BACKGROUND ART

Thin films of crystalline material are important in many fields of science and technology. In semiconductor electronics, there is considerable research and development directed toward obtaining high-quality semiconductor films on insulating substrates, especially silicon (Si) on insulator films of silicon dioxide ($SiO_2$). Such structures are conventionally called SOI structures. One successful approach to SOI has been to form an $SiO_2$ layer on a single crystal Si wafer and then to deposit Si by chemical vapor deposition (CVD) on the $SiO_2$ insulator to form a polysilicon layer on the $SiO_2$. Next, the polysilicon layer is formed into a single crystal layer by a number of techniques, such as Zone Melting and Recrystallization (ZMR). The top silicon film is then used to construct silicon devices which are isolated from each other by the underlying $SiO_2$ insulator.

Devices formed on SOI substrates are capable of superior performance compared to devices formed on bulk Si substrates. This results from the fully dielectric isolation produced by the underlying $SiO_2$ insulator of the SOI structure. Chief among the improved properties is higher packing density, higher radiation tolerance, faster switching speeds and CMOS circuits free of latch-up.

The present invention relates to improvements in the ZMR process used to form SOI substrates. In one version of the ZMR process, the recrystallization of the polysilicon layer is seeded or nucleated by the underlying single crystalline silicon wafer. A precursor structure comprising an insulating oxide layer is formed on the Si substrate. The oxide layer is then etched or scribed down to the underlying bulk single crystalline silicon wafer; thus exposing single crystalline Si seed regions. Then a polysilicon layer is deposited on the precursor structure. The polysilicon layer contacts the exposed Si seed regions. An optional capping layer is formed over the polysilicon.

In the past, the seed opening to the silicon wafer was in the shape of a relatively wide (about 10 microns or wider) continuous circular pattern about the periphery of the wafer near the edge. A stationary heater elevates the polysilicon layer to about 1000° C.–1300° C., i.e., near the melting point of the polysilicon. A moveable heating element is then translated past the structure to melt the polysilicon as the heating source moves along its path. Upon recrystallization, the polysilicon film is transformed to single or nearly single crystalline film seeded by the underlying bulk silicon wafer.

Several problems have been found with the above-described process. One is the serious tendency for the polysilicon melt to promote the mass flow of material away from the silicon seed, preventing uniform seeding. It would be very beneficial to avoid or reduce this tendency.

Another of the problems presently associated with the ZMR process is that the regions of polysilicon at which the seed openings are formed clearly cannot be used for device formation. Thus, portions of the wafer is wasted or non-productive. It would therefore be advantageous to minimize the area of such seed openings.

Also, without proper orientation of the seed openings, there is a substantial uncertainty in the seeding of the polysilicon as the melt traverses the structure. The polysilicon, which is not properly seeded during this uncertainty, also is not usable for device fabrication. Thus, it would be very advantageous to minimize this uncertainty in practice.

DISCLOSURE OF THE INVENTION

In one embodiment of the present invention, relatively small width discontinuous, generally semi-circular pattern of seed openings are formed in an SOI precursor structure. We have found that in a continuous circular seed opening pattern, the polysilicon melt has a tendency to evaporate from the silicon seed. This may be due to excessive heat buildup (thermal gradient) from the hot strip heater exposure to the large area, high thermal conductivity silicon material. With a discontinuous and reduced width pattern, the area of the surface exposed to the heater at any one time is minimized, counteracting thermal buildup. These two improvements decrease the material flow away from the seed. The discontinuous pattern is formed of a discontinuous sub-pattern of overlapping openings of various shape. The preferred orientation of the seed openings is [100] or about a 45° angle to the [110] Si wafer flat. It is noted that all other angle of seed openings will work, but this 45° angle to the [110] flat works best. The direction of seeding (direction the heater is scanned) is transverse this orientation. The preferred transverse width of the seed openings has been found to be about 5 microns, or less. The angle a between the sidewalls of the seed opening and the surface should preferably be greater than 90°, i.e., an obtuse angle, although other angles appear to work satisfactorily. Seed opening patterns may vary greatly provided certain basic parameters are present. Overlapping of patterns is preferred for successful seeding for reasonable length/width ratios.

A slightly modified semi-circular pattern of seed openings has been found to produce successful seeding. This configuration minimizes seed opening widths, and maximizes the useful area of the wafer, as compared, for example, to a continuous circular pattern. The [100] orientation of the seeding pattern combined with a [100] direction scan produces the most favorable seeding pattern.

The above and other features of the invention will now be explained in conjunction with the drawings.

BRIEF DESCRIPTION OF THE DRAWINGS

FIG. 7 is an enlarged view of an alternate dotted seed pattern embodiment.

FIG. 8a–d is a schematicized cross-sectional view of an alternate edge bead seeding embodiment of the invention.

DETAILED DESCRIPTION OF THE INVENTION

Figure 1:
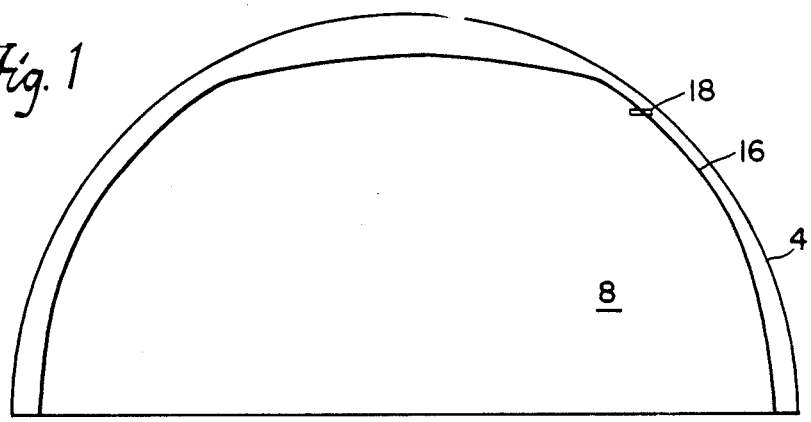
FIG. 1 is a plan view of one-half of a Si wafer showing a first embodiment of the small seed width and discontinuous seed patterning of the invention.

Referring now to FIG. 1, there is shown one-half of a SOI structure 8 with small seed opening width showing the discontinuous generally semi-circular pattern 16 of shaped seed openings near the periphery 4 of the SOI structure 8. Pattern 16, in turn, is formed of a discontinuous sub-pattern 6 formed of shaped openings 20, as shown in FIG. 2, which is an enlarged region 18 of FIG. 1.

Figure 2:
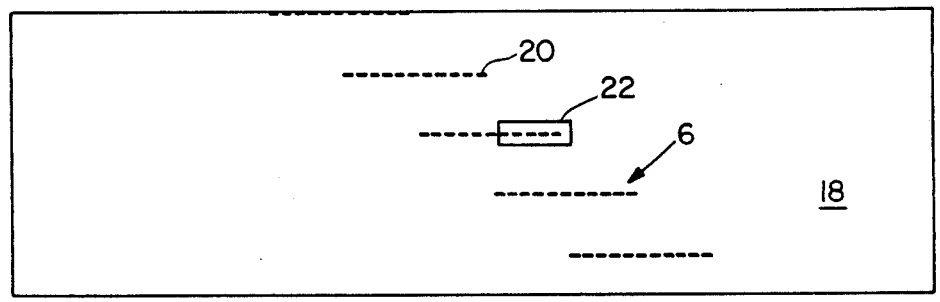
FIG. 2 is an enlarged view of a portion 18 of FIG. 1.
Figure 3:
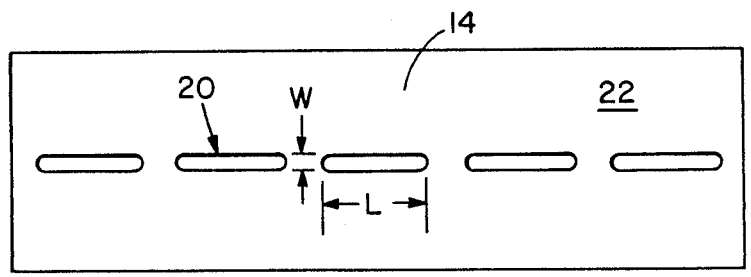
FIG. 3 is an enlarged view of a portion 22 of region 22 of FIG. 2.

FIG. 3 is a further enlargement of region 22 of FIG. 2 showing in greater detail, the shape of the openings 20, which form the sub-patterns 6 which constitute the discontinuous generally semicircular pattern 16 of FIG. 1. The seed openings 20, as may be seen in FIG. 3, are generally rectangular in shape, with smooth curved ends. The pattern 16 is formed within about one-half inch from the wafer edge 4. The dashed seed opening pattern shape in FIG. 3 preferably has a length-to-width ratio of greater than 1 and, as may be seen in FIG. 2, each subpattern overlaps with the next adjacent pattern. This seeding arrangement provides a critical advantage over the continuous circular seed opening in terms of the heat exposure to the substrate bulk silicon 10.

Figure 4:
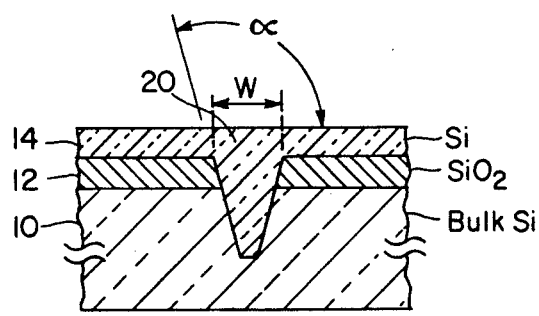
FIG. 4 is a cross sectional view of one of the seed openings 20 of FIG. 3.

As shown in FIG. 4, the angle a of the openings 20 is preferably greater than 90° for optimum seeding. The width W of the opening through the polysilicon 14 and SiO2 insulator 12 to the bulk silicon substrate 10 is preferably less than or equal to five microns, although one micron to nine microns seed with openings have worked successfully.

Figure 5:
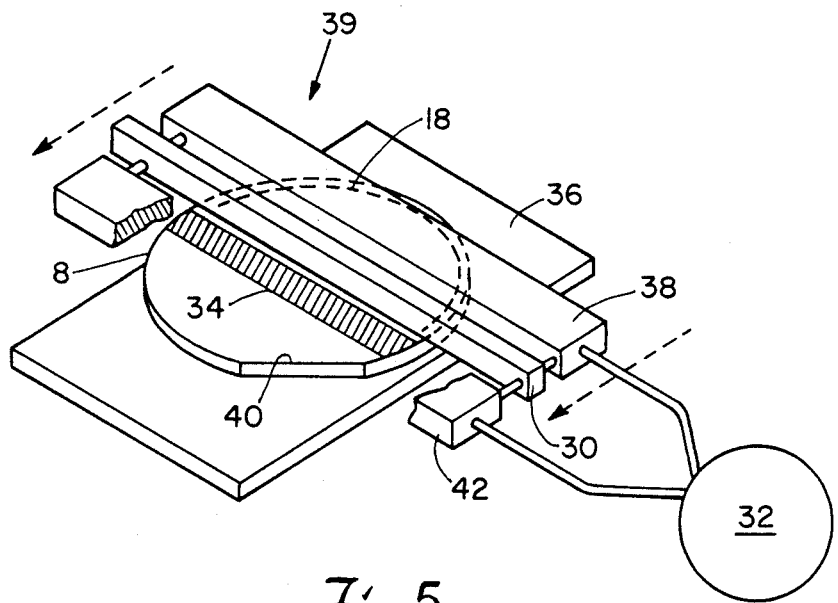
FIG. 5 is a perspective view of a ZMR apparatus illustrating the process as applied to the seed patterned structure of the invention.

As shown in FIG. 5, it is preferable to orient the seed opening pattern at a 45° angle to the [110] Si wafer flat 40 (the [100] seed orientation), since this orientation produces the least perturbation to the melt front. The [100] orientation is the most favorable seeding orientation with the scan of the heater also along the [100] line, as shown by the arrows in FIG. 5.

In the partially exploded view of FIG. 5, a sample SOI structure 8 is shown subjected to a thermal treatment by being disposed on a stationary lower strip heater 36, while the moveable upper strip heater 39 is mechanically translated past the SOI structure 8 in the direction of the arrows. The upper heater 39 is comprised of a central heater 30 disposed between fore and aft heaters 42 and 38, respectively. The upper heater 39 is coupled to a heat control unit 32 so that the temperature of the heaters 38 and 42 may be controlled separately from each other and from the other units. The lower heater is typically maintained at about 1100° C., while the upper aft heater 38 is set at about 1600° C. and the foremost heater 42 is set at about 1300° C. and the aft heater at 1400° C. Under these conditions, the top wafer surface first sees a temperature of about 1300° C. before encountering the elevated temperature of the main heater 30. A molten zone 34 is created in the polysilicon film. As the moveable heaters pass by the wafer, this molten zone is initially formed at the top right edge of the wafer and is seeded through the discontinuous openings in the pattern 16 and moves from right to left in the direction of the arrows of FIG. 5. As shown in FIG. 5, it is not necessary to complete the pattern throughout the whole circular periphery of the wafer, since once it passes the mid-point, the whole width of the wafer has been seeded by the underlying silicon substrate.

Figure 6:
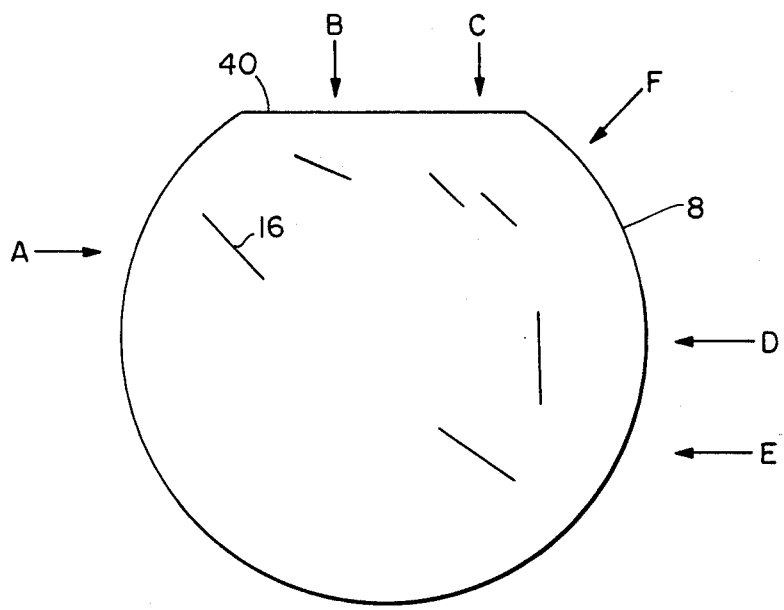
FIG. 6 is a plan view of a mask structure for a wafer showing various seed orientation.

A number of seed opening orientation patterns have been tested, as shown in FIG. 6. Five such patterns, A–E, were formed in a SOI structure 8, having a [100] direction flat 40. In this case, the upper heater is scanned in the [100] direction, shown by the arrow labeled F. The pattern at A, which is 45° to the [100] flat proved to be the most successful orientation. The seed opening B, which is orientated at the [111] direction resulted in unsure seeding at the beginning, but after the molten zone traveled a distance, the polysilicon recrystallized oriented in the [100] plane. The seed opening pattern shown by arrow C slightly off the [100], also resulted in unsure seeding at first, but ultimately became oriented in the [100] direction. The seed opening shown by the arrow D likewise initially resulted in unsure crystallization, and then became oriented in the [110] direction and the seed opening pattern of pattern E, while initially resulting in unsure crystallization, ended up oriented in the [210] direction.

An alternative sub-pattern of seed openings 6' is shown enlarged in FIG. 7. This sub-pattern consists of circular openings, or dots, 20'. This pattern has also been found to form successful seeding, provided the diameter of the openings and the angle of the sidewalls, down to the silicon wafer, are within the parameters referenced above.

An alternate seeding process, edge bead seeding, relies on use of a ring heater to maintain a constant thermal gradient even with material exposure to the hot strip heater. In this case, the seed width opening is not critical. This process, called edge bead seeding, allows seeding at the very edge of the wafer where there is a large heat sink. With this process, the limitations described earlier, may be avoided.

This alternate seeding process shall now be described in connection with FIGS. 8a–c. In this method, a seed opening 19 is created at the edge of the wafer 10, rather than the usual printed seed pattern within the perimeter. The starting structure 100 (FIG. 8a) consists of single crystalline Si wafer 10', and an SiO2 insulator film 12'. A resist layer 15 is formed on the insulator 12'. The new method consists of squirting or spraying a photoresist solvent on the underside of the SOI precursor structure 100 which is spinning on a chuck (not shown). The centrifugal force associated with the spinning causes the resist to bead up and flow to the outside edge of the wafer and curl up around to the surface edge once the spin speed and amount of solvent is adjusted. Using this method, about 1/4 inch of photoresist 15 is removed from the top surface edge (FIG. 8b) leaving a peripheral edge 17 of SiO2 12' exposed. The exposed SiO2 12' is then removed by a suitable etchant, leaving an exposed peripheral seed edge 19' (FIG. 8c). Then, when the polysilicon layer 14' is deposited on the SiO2 12', a peripheral edge 21' of the polysilicon layer 14' is in contact with a peripheral edge of the Si wafer 10' (FIG. 8d). The advantage is a seeding process simplification. No projection aligner or automated development process is required for the seeding step of the SOI structure fabrication. The seed is thus at the very edge of the surface and maximizes the usable SOI area per wafer and eliminates several conventional processing steps to achieve the seed.

Equivalents

This completes the description of the preferred embodiments of the invention. Note that while the term "film" or "layer" has been used herein to denote a thin body of material covering a substrate, such terms are also intended to cover portions or regions of a substrate. Furthermore, while SiO$_2$ has been used as the insulator in the examples given, other insulators, such as silicon nitride or oxynitride, are contemplated for use in the process of the invention. While the invention has been particularly shown and described with reference to such embodiments, it should be understood that those skilled in the art would be capable of devising various changes in form and detail without departing from the spirit scope of the invention.

We claim:

1. In a zone melting and recrystallization process in which a polysilicon film formed over an insulator film over a silicon wafer is melted, by translating a heater past the wafer, and allowed to recrystallize to form a substantially single crystal silicon film seeded by said silicon wafer through seed openings formed through the insulator to the silicon wafer, the improvement comprising forming said seed openings in a discontinuous pattern formed of discontinuous sub-patterns of shaped seed openings, said pattern extending in a semi-circle closely adjacent the periphery of the wafer.

2. The process of claim 1 wherein the wafer has a [110] direction flat and the seed openings are oriented at a 45° angle to that direction on a [100] silicon wafer.

3. The process of claim 1 wherein the seed openings extend at an obtuse angle to the plane of the silicon wafer.

4. The process of claim 1 wherein the seed openings have a length-to-width ratio greater than unity.

5. The process of claim 1 wherein the width of the seed openings is less than or equal to about 5 microns.

6. The process of claim 1 wherein the sub-patterns overlap each other.

7. In a zone melting and recrystallization process in which a polysilicon film formed over an insulator film over a silicon wafer is melted and allowed to recrystallize to form a substantially single crystal silicon film seeded by said silicon wafer through seed openings formed through the insulator to the silicon wafer, the improvement comprising forming said seed openings in a discontinuous main pattern formed of a discontinuous sub-pattern extending in a semi-circle about the periphery of said wafer with openings less than about 5 microns and melting the polysilicon film by passing a heater by said wafer in a direction commencing with the center of said semicircle and proceeding across said wafer to the other side thereof.

8. The process of claim 7 wherein the wafer has a [100] direction flat and the seed openings are oriented at a 45° angle to that direction.

9. The process of claim 7 wherein the seed openings extend at an obtuse angle to the plane of the silicon wafer.

10. The process of claim 7 wherein the seed openings are rectangular.

11. In a zone melting and recrystallization process in which a polysilicon film is formed over an insulator film over a silicon wafer and is melted and allowed to recrystallize to form a substantially single crystal silicon film seeded by said silicon wafer through seeded openings formed through the insulator to the silicon wafer, the improvement comprising forming said seed openings by removing the outer peripheral edge of the insulator film before the polysilicon film is formed, so that when the polysilicon film is formed over the insulator film, the peripheral edge of the polysilicon film is in contact with the peripheral edge of the silicon wafer.

12. The process of claim 11 wherein the outer peripheral edge of the insulator film is removed by:

(a) forming a precursor structure comprising a resist film over the insulator film formed over the silicon wafer;

(b) rotating the precursor structure while spraying resist solvent on the peripheral edge of the resist film and dissolving that edge; thus exposing the insulator film around the edge;

(c) etching the peripheral edge of the insulator film to expose the peripheral edge of the wafer using the remaining resist film as an etch mask;

(d) removing the resist mask;

(e) forming the polysilicon film over the insulator film such that polysilicon is in contact with the peripheral edge of the wafer substrate.

13. The process of claim 12 wherein the insulator is SiO$_2$.

* * * * *